(12) United States Patent
Ishikawa et al.

(10) Patent No.: US 7,859,172 B2
(45) Date of Patent: Dec. 28, 2010

(54) PIEZOELECTRIC RESONATOR, MANUFACTURING METHOD THEREOF AND LID FOR PIEZOELECTRIC RESONATOR

(75) Inventors: Katsuo Ishikawa, Tatsuno (JP); Akitoshi Hara, Fujimi (JP); Yukihiro Tonegawa, Minowa (JP)

(73) Assignee: Epson Toyocom Corporation (JP)

( * ) Notice: Subject to any disclaimer, the term of this patent is extended or adjusted under 35 U.S.C. 154(b) by 4 days.

(21) Appl. No.: 12/141,187

(22) Filed: Jun. 18, 2008

(65) Prior Publication Data
US 2008/0315727 A1    Dec. 25, 2008

(30) Foreign Application Priority Data
Jun. 19, 2007 (JP) ............................... 2007-161282
Mar. 27, 2008 (JP) ............................... 2008-083416

(51) Int. Cl.
*H01L 41/08*    (2006.01)
*H01L 41/053*   (2006.01)
(52) U.S. Cl. ....................................... 310/348; 310/370
(58) Field of Classification Search ................. 310/348, 310/370
See application file for complete search history.

(56) References Cited

U.S. PATENT DOCUMENTS

| 3,593,257 | A | * | 7/1971 | Massa, Jr. | .................... 367/155 |
| 4,405,875 | A | * | 9/1983 | Nagai | .......................... 310/344 |
| 5,354,695 | A | * | 10/1994 | Leedy | ........................ 438/411 |
| 6,020,257 | A | * | 2/2000 | Leedy | ........................ 438/626 |
| 6,114,800 | A | * | 9/2000 | Unami et al. | ................ 310/344 |
| 6,321,444 | B1 | * | 11/2001 | Yatsuda et al. | ................. 29/832 |
| 6,628,179 | B2 | * | 9/2003 | Yatsuda et al. | ............... 333/193 |

(Continued)

FOREIGN PATENT DOCUMENTS

JP        53-096691       8/1978

(Continued)

*Primary Examiner*—J. SanMartin
(74) *Attorney, Agent, or Firm*—Harness, Dickey & Pierce, P.L.C.

(57) ABSTRACT

A piezoelectric resonator includes a piezoelectric resonator element having a resonating arm and a metal film that is formed on the resonating arm; a package including a bottom part on which the piezoelectric resonator element is fixed and a frame wall that surrounds the bottom part, and having an opening above the bottom part; and a lid including a frame in which a through hole is provided and an optically transparent part that has an upper face and a lower face of the frame and is disposed at the through hole, the through hole penetrating a front face and a back face, the lower face of the optically transparent part being disposed so as to oppose the metal film, and the lid closing the opening of the package such that the lid overlaps with the bottom part and the frame wall, the through hole having a curved inner wall face whose curved face is coupled with at least one of the front face and the back face at least one opening edge of the front face and the back face and a vertical inner wall face that is provided vertical to the front face and the back face and in a part of a thickness direction of the frame, and the optically transparent part being provided so as to contact closely with at least a part of the vertical inner wall face and at least a part of the curved inner wall face.

14 Claims, 4 Drawing Sheets

U.S. PATENT DOCUMENTS

| | | | |
|---|---|---|---|
| 6,960,870 B2 * | 11/2005 | Kikushima et al. | 310/344 |
| 7,170,369 B2 * | 1/2007 | Huang et al. | 333/186 |
| 2009/0001856 A1 * | 1/2009 | Hara et al. | 310/348 |

FOREIGN PATENT DOCUMENTS

| | | | |
|---|---|---|---|
| JP | 57-043628 | | 8/1980 |
| JP | 62-163347 | | 7/1987 |
| JP | 05041464 A | * | 2/1993 |
| JP | 2003-229739 | | 8/2003 |
| JP | 2005-151336 | | 6/2005 |
| JP | 2005-191314 | | 7/2005 |

* cited by examiner

PIEZOELECTRIC RESONATOR, MANUFACTURING METHOD THEREOF AND LID FOR PIEZOELECTRIC RESONATOR

BACKGROUND OF THE INVENTION

1. Technical Field

The present invention relates to a piezoelectric resonator, a manufacturing method thereof and a lid for a piezoelectric resonator.

2. Related Art

A piezoelectric resonator element is typically fixed within a package and enclosed therein with a lid. JP-A-2005-191314 is an example of related art. The example disclosed a lid that has a window through which the inside of the package can be optically seen even after the package is sealed with the lid. According to the example, a windowpane is fixed such that a glass plate whose size is smaller than a diameter of an opening of a metal frame and whose thickness is larger than the metal frame is placed so as to cover the opening of the metal frame, the glass plate is softened by heat then pressed and spread, and a part of the glass which protrudes out from the metal frame is ground and removed. Where the windowpane is fixed this way, there is a possibility that the glass plate can be broken by grinding. In addition, according to the example, the inner faces of the metal frame is curved so that the stress is easily concentrated in a part of the glass plate when a force works in the thickness direction of the metal frame and the glass plate and a direction in which the glass contracts and stretches, increasing the possibility of the breakage of the glass. Moreover, the lid has to be made thin in order to decrease the height of the piezoelectric resonator, there is a higher possibility of the breakage of the glass.

SUMMARY

An advantage of the present invention is to provide a lid having a transparent window part that has a small possibility of breaking and being used for a piezoelectric resonator.

A piezoelectric resonator according to a first aspect of the invention includes a piezoelectric resonator element having a resonating arm and a metal film that is formed on the resonating arm; a package including a bottom part on which the piezoelectric resonator element is fixed and a frame wall that surrounds the bottom part, and having an opening above the bottom part; and a lid including a frame in which a through hole is provided and an optically transparent part that has an upper face and a lower face and is disposed at the through hole, the through hole penetrating a front face and a back face of the frame, the lower face of the optically transparent part being disposed so as to oppose the metal film, and the lid closing the opening of the package such that the lid overlaps with the bottom part and the frame wall, the through hole having a curved inner wall face whose curved face is coupled with at least one of the front face and the back face at least one opening edge of the front face and the back face and a vertical inner wall face that is provided vertical to the front face and the back face and in a part of a thickness direction of the frame, and the optically transparent part being provided so as to contact closely with at least a part of the vertical inner wall face and at least a part of the curved inner wall face. According to the first aspect of the invention, the though hole has the vertical inner wall face which is provided vertical to the front face and the back face. The stress in this part is dissipated even when a force is relatively applied in the thickness direction of the optically transparent part and the frame therefore it is possible to lower the possibility of damaging the optically transparent part.

In this case, the through hole may have a first curved inner wall face whose curved face is coupled with the front face at the opening edge of the front face and a second curved inner wall face whose curved face is coupled with the back face at the opening edge of the back face, wherein a curvature radius of the first curved inner wall face may be larger than a curvature radius of the second curved inner wall face.

Moreover, at least one of the upper face and the lower face of the optically transparent part may be formed so as to be leveled with the front face or/and the back face of the lid.

Alternatively, at least one of the upper face and the lower face of the optically transparent part may be formed so as to protrude out from the front face or/and the back face of the lid.

Furthermore, an opening of the through hole may have a circular shape.

Moreover, an opening may be formed in the metal film by using a laser beam.

A lid for a piezoelectric resonator according to a second aspect of the invention includes a frame having a through hole that penetrates a front face and a back face of the frame, the through hole having a curved inner wall face whose curved face is coupled with at least one of the front face and the back face at least one opening edge of the front face and the back face and a vertical inner wall face that is provided vertical to the front face and the back face and in a part of a thickness direction of the frame; and an optically transparent part having an upper face and a lower face, the optically transparent part being disposed such that the upper face faces in a same direction as the front face faces and the lower face faces in a same direction as the back face faces, the optically transparent part being provided so as to contact closely with at least a part of the vertical inner wall face and at least a part of the curved inner wall face, and the lid closing an opening of a package in which a piezoelectric resonator element is fixed such that the lid overlaps with the package. According to the second aspect of the invention, the though hole has the vertical inner wall face which is provided vertical to the front face and the back face. The stress in this part is dissipated even when a force is relatively applied in the thickness direction of the optically transparent part and the frame therefore it is possible to lower the possibility of damaging the optically transparent part.

In this case, the through hole may have a first curved inner wall face whose curved face is coupled with the front face at the opening edge of the front face, and a second curved inner wall face whose curved face is coupled with the back face at the opening edge of the back face, wherein a curvature radius of the first curved inner wall face may be larger than a curvature radius of the second curved inner wall face.

Moreover, at least one of the upper face and the lower face of the optically transparent part may be formed so as to be leveled with the front face or/and the back face of the lid.

Alternatively, at least one of the upper face and the lower face of the optically transparent part may be formed so as to protrude out from the front face or/and the back face of the lid.

Furthermore, an opening of the through hole may have a circular shape.

A method for manufacturing a piezoelectric resonator according to a third aspect of the invention includes a) forming a lid that includes a frame which has a front face and a back face and an optically transparent part whose thickness is larger than a thickness of the frame, by placing the optically transparent part in a through hole that penetrates the front face and the back face of the frame, heating the optically transparent part and the frame, and pressing the optically transparent part with a pair of parallel faces such that the optically transparent part closely contacts with an inner wall face of the through hole and has an upper face and a lower face; b) providing a package that includes a bottom part, a frame wall surrounding the bottom part, and an opening situated above the bottom part and fixing a piezoelectric resonator element on the bottom part, the piezoelectric resonator element having a resonating arm and a metal film that is formed on the resonating arm; and c) closing the opening of the package with the lid by placing the lid such that the lower face of the optically transparent part opposes the metal film and jointing the frame wall part with the lid, wherein the through hole having a curved inner wall face whose curved face is coupled with at least one of the front face and the back face at least one opening edge of the front face and the back face and a vertical inner wall face that is provided vertical to the front face and the back face and in a part of a thickness direction of the frame, and the optically transparent part being provided so as to contact closely with at least a part of the vertical inner wall face and at least a part of the curved inner wall face. According to the third aspect of the invention, the though hole has the vertical inner wall face which is provided vertical to the front face and the back face. The stress in this part is dissipated even when a force is relatively applied in the thickness direction of the optically transparent part and the frame therefore it is possible to lower the possibility of damaging the optically transparent part.

In this case, the step a) may include placing the frame on a table such that the back face faces the table, disposing the optically transparent part on the table with the though hole interposed therebetween, and pressing the optically transparent part by a press tool that opposes the table, and the through hole may have the curved inner wall face whose curved face is coupled with the front face at the opening edge of the front face.

In this case, the method may further include step d) removing a part of the metal film with a laser beam, wherein the metal film is removed by irradiating the metal film with the laser beam through the optically transparent part after the opening of the package is closed with the lid.

In this case, the method may further include vacuuming an inside of the closed package through a vent-hole that is formed in the package after the opening of the package is closed with the lid, and closing the vent-hole, wherein the step d) may be conducted after the vacuuming.

Moreover, the step d) may be conducted also before the piezoelectric resonator element is fixed on the bottom part.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described.

Piezoelectric Resonator Element (Before Embedded in a Piezoelectric Resonator)

Figure 1:
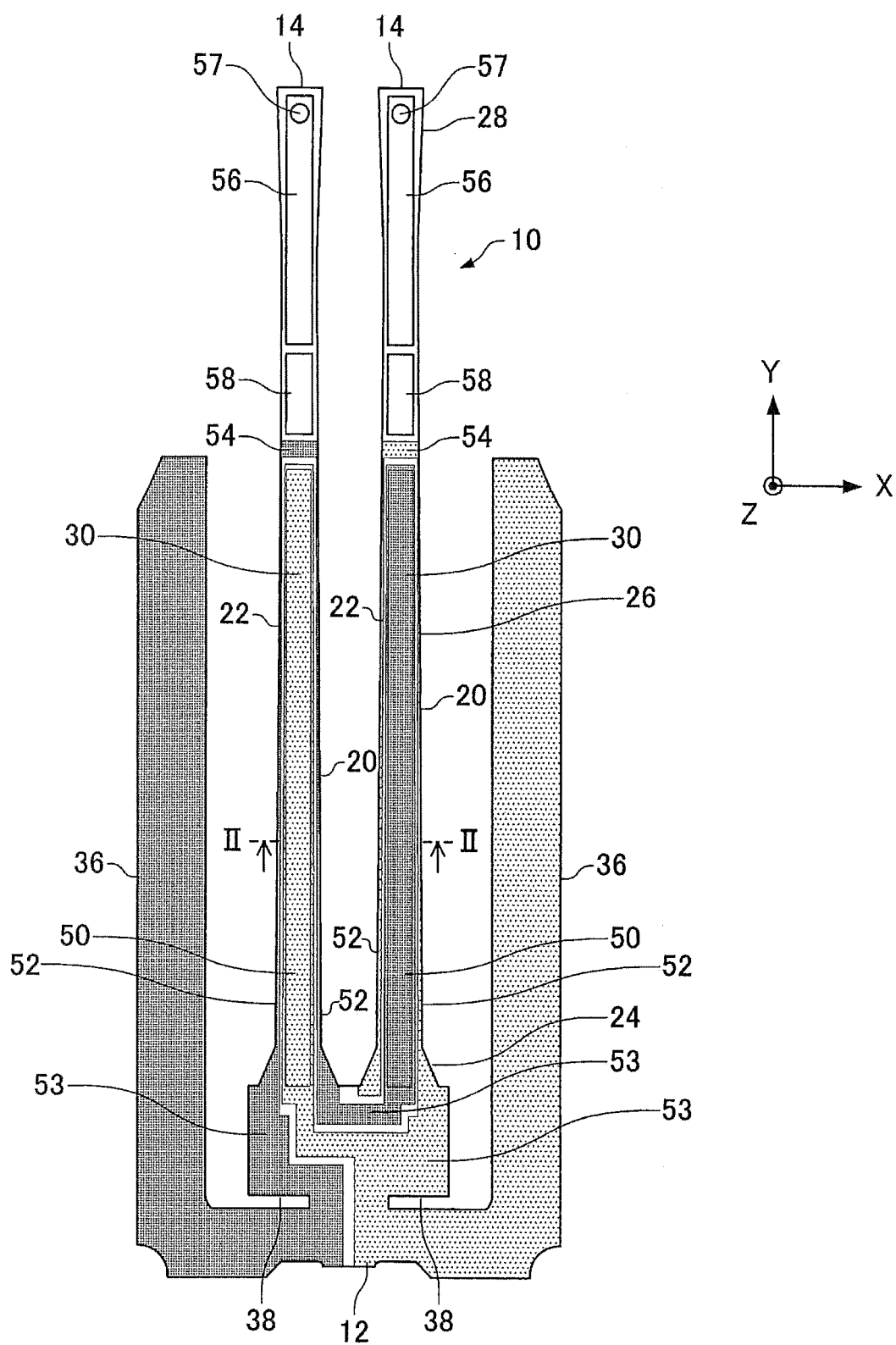
FIG. 1 is a plan view of a piezoelectric resonator element (a tuning-fork type piezoelectric resonator element) which is used in a piezoelectric resonator according to an embodiment.

FIG. 1 is a plan view of a piezoelectric resonator element (a tuning-fork type piezoelectric resonator element) which is used in a piezoelectric resonator according to an embodiment. A bottom view of a piezoelectric resonator element 10 will be illustrated symmetrically to the plan view. The piezoelectric resonator element 10 is made of a piezoelectric material such as quartz crystal, lithium tantalite and lithium niobate. The piezoelectric resonator element 10 includes a base part 12 and a resonating arm 14 which extends from the base part 12. A pair of the resonating arms 14 is provided in the piezoelectric resonator element 10.

Figure 2:
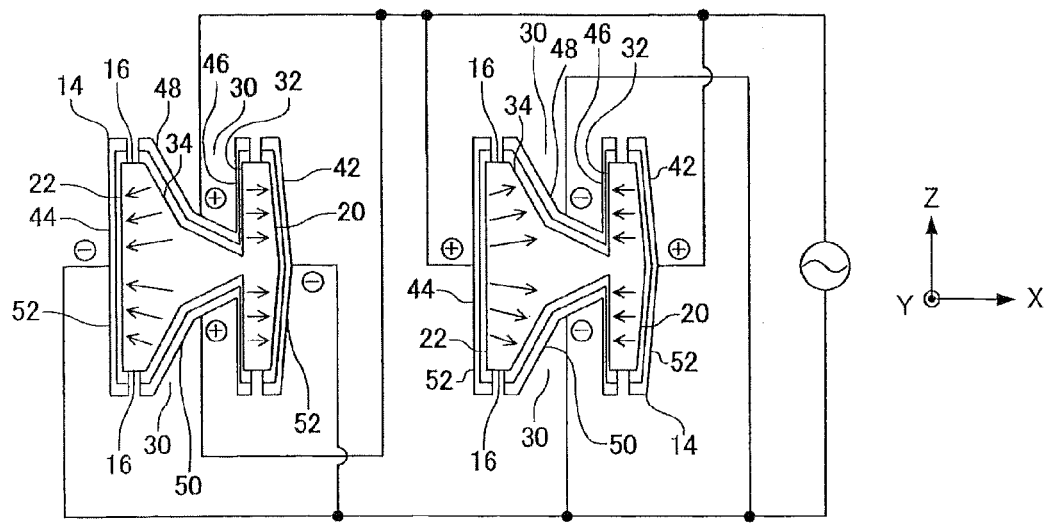
FIG. 2 is an enlarged sectional view of the piezoelectric resonator element along the line II-II in FIG. 1.

FIG. 2 is an enlarged sectional view of the piezoelectric resonator element 10 along the line II-II in FIG. 1. The resonating arm 14 includes front-back faces 16 having two sides facing opposite each other, and a first lateral face 20 and a second lateral face 22 that couple with the front-back faces 16 respectively.

The first lateral face 20 of one of the resonating arms 14 (left one in FIG. 1) is arranged parallel to the second lateral face 22 of the other resonating arm 14 (right one in FIG. 1) and so as to oppose each other. The first lateral face 20 is formed so as to have a mountain-like shape whose peak is situated in the direction corresponding to the middle of the resonating arm 14 (see FIG. 2) whose thickness is defined by the distance between the front-back faces 16. The height of the mountain shape of the first lateral face 20 is over 0% to 12.5% inclusive of the thickness of the resonating arm 14 which is decided by the distance between the first lateral face 20 and the second lateral face 22.

In the resonating arm 14, a root part 24 which is coupled to the base part 12 is formed to have a shape whose width broadens toward the base part 12. The root part 24 joints with the base part 12 at its wide part so that the rigidity is high. The resonating arm 14 also includes a first tapered part 26 whose width, which is defined by the distance between the first lateral face 20 and the second lateral face 22, is tapered from the base part 12 toward the end part of the resonating arm 14. The first tapered part 26 promotes the resonating arm 14 resonate. The resonating arm 14 also includes a second tapered part 28 which is placed closer to the end part of the resonating arm 14 than the first tapered part 26. A width of the second tapered part 28 broadens from the first tapered part 26 toward the end part of the resonating arm 14. The second tapered part 28 serves as a weight with which it is possible to lower the resonance frequency. In the resonating arm 14, a width changing point where the first tapered part 26 joints with the second tapered part 28 is situated at a closer to the end part than a position of a long groove 30.

The long groove 30 which extends in the longitudinal of the resonating arm 14 is provided on the front-back faces 16 respectively. The long groove 30 makes the resonating arm 14 move easier and the resonating arm can resonate efficiently, lowering crystal impedance (CI). A length of the long groove 30 is 50-70% of the length of the resonating arm 14. A width of the long groove 30 is 60-90% of the width of the resonating arm 14.

The long groove 30 includes a first inner face 32 whose back side extends so as to oppose the first lateral face 20, and a second inner face 34 whose back side extends so as to oppose the second lateral face 22. The angle between the first inner face 32 and the front-back face 16 is smaller than the angle between the second inner face 34 and the front-back face 16 and is rather a right angle. The inner face 32 can be a flat face. The second inner face 34 can also be a flat face, though the second inner face 34 according to the embodiment shown in FIG. 2 consists of jointed planes which have different angles and are jointed each other. The angle between the first lateral face 20 and the front-back face 16 and the angle between the second lateral face 22 and the front-back face 16 (at the joint part) are more like perpendicular compared to the angle between the second inner face 34 and the front-back face 16.

The piezoelectric resonator element 10 further includes a supporting arm 36. Two supporting arms 36 are provided so as to form a pair. The supporting arms 36 in pair first extend from the base part 12 toward the opposite direction each other and in the direction intersecting the pair of the resonating arm 14. The supporting arms 36 in pair then bend and extend toward the direction in which the resonating arm 14 extends. Since the supporting arms 36 are bent, the size of the supporting arm can be made small. The supporting arms 36 are parts attached to a package 60. The resonating arms 14 and the base part 12 stay contactless with or float in the package by the supporting arms 36.

An incision 38 is formed in the base part 12. A pair of the incisions 38 is provided so as to oppose each other and to show the narrow part of the resonating arm 14 in the same side as the front-back face 16. The pair of the incisions 38 is formed in the base part 12 and each of the incisions 38 is formed adjacent to the supporting arm 36 and on the side where the supporting arm 36 extends from the base part 12 and bends. The oscillation which is transmitted through the resonating arm 14 is interrupted by the incisions 38 thereby it is possible to prevent the oscillation (the oscillation leakage) from being transmitted outside through the base part 12 and the supporting arm 36. In this way, the increase in the crystal impedance (CI) can be controlled. The longer (deeper) the incision 38 is in the extent where the strength of the base part 12 is secured, the larger the effect of preventing the oscillation leakage. The distance between the pair of the incisions 38 (the intervening width between the incisions 38) can be smaller or larger than the distance between the first lateral face 20 and the second lateral face 22 which oppose each other in the pair of the resonating arms 14. Furthermore the distance between the pair of the incisions 38 can be smaller or larger than the distance between other first lateral face 20 and other second lateral face 22 which face outside in the pair of the resonating arms 14.

An excitation electrode film is formed on the resonating arm 14. The excitation electrode film can have a multilayered structure including a Cr film whose thickness is 100-300 Å as a base film and on top of which, an Au film whose thickness is 200-500 Å. The Cr film has a fine adhesion to the quartz crystal and the Au film has a high electric resistance and is difficult to be oxidized. The excitation electrode film includes a first lateral face electrode film 42 and a second lateral face electrode film 44 which are provided on the first lateral face 20 and the second lateral face 22 respectively. The excitation electrode film also includes a first inner face electrode film 46 and a second inner face electrode film 48 which are provided on the first inner face 32 and the second inner face 34 respectively. The excitation electrode film forms excitation electrodes 50, 52.

The first excitation electrode 50 includes the first inner face electrode film 46 and the second inner face electrode film 48 which are provided in the long groove 30. The first inner face electrode film 46 and the second inner face electrode film 48 are formed contiguously and electrically coupled each other in the long groove 30. The first and second inner face electrode films 46, 48 which are formed in the long groove 30 of one of the front-back faces 16 (for example the front face) are electrically coupled with the first and second inner face electrode films 46, 48 which are formed in the long groove 30 of the other of the front-back faces 16 (for example the back face). In other words, a pair of the first excitation electrodes 50 which are respectively formed on the front-back faces 16 is electrically coupled each other. The first excitation electrodes 50 in pair which are formed in one of the resonating arms 14 in pair are coupled to extension electrodes 53 which are respectively formed on the front-back faces 16 of the base part 12. The extension electrodes 53 are also coupled with the first and second lateral face electrode film 42, 44 in the other resonating arm 14. In this way, the first excitation electrodes 50 are electrically coupled with the first and second lateral face electrode film 42, 44.

The second excitation electrode 52 includes the first lateral face electrode film 42 and the second lateral face electrode film 44. The first lateral face electrode film 42 and the second lateral face electrode film 44 are electrically coupled each other. These electrodes are electrically coupled through a coupling electrode 54 which is formed on at least one (or both) of the front-back faces 16 and in an area where the long groove 30 of the resonating arm 14 is not formed. The first excitation electrode 50 which is formed in one of the resonating arms 14 is electrically coupled to the second excitation electrode 52 which is formed in the other resonating arm 14 through the extension electrode 53 which is disposed on the base part 12. The extension electrode 53 is formed so as to extend onto the supporting arm 36 which is arranged next to the resonating arm 14 on which the second excitation electrode 52 is provided. The extension electrode 53 is formed on the front-back faces 16 (and on the side face) of the supporting arm 36. A part of the extension electrode 53 on the supporting arm 36 can be used as an external electric connection.

A first metal film 56 and a second metal film 58 are formed at least one of the front-back faces 16 of the resonating arm 14. The front-back faces 16 are made of the material forming the resonating arm 14. The first and second metal films 56, 58 are directly provided on the front-back faces 16. The excitation electrode film is formed in the area other than where the first and second metal films 56, 58 are disposed. The first metal film 56 is arranged closer to the end part of the resonating arm 14 compared to the second metal film 58. The thickness of the first metal film 58 is larger than that of the second metal film 58.

The first and second metal films 56, 58 serve as a weight for the resonating arm 14. The weight can be adjusted by removing a part of the metal films. When the weight of the end part of the resonating arm 14 is heavy, the resonance frequency of the resonating arm 14 becomes low, whereas the resonance frequency becomes high when the weight is small. In this way, the frequency can be adjusted. An opening 57 is formed in the first metal film 56. A part of the opening 57 penetrates the metal film, exposing a part of the front-back faces 16 of the resonating arm 14.

Mechanism of the Piezoelectric Resonator Element

According to the embodiment, one side end of the resonating arm 14 is elongated and the other side end of the resonating arm 14 is contracted when a voltage is applied between the first lateral face electrode film 42 and the first inner face electrode film 46 and between the second lateral face electrode film 44 and the second inner face electrode film 48. In this way the resonating arm 14 is bent and vibrated. In other words, the first and second lateral faces 20, 22 of the resonating arm 14 elongates and contracts when a voltage is applied between the first excitation electrode 50 and the second excitation electrode 52, and the resonating arm 14 vibrates. It is known that the CI decreases as the first and second excitation electrodes 50, 52 become longer to the extent where the length reaches to 70% of the resonating arm 14.

FIG. 2 illustrates the mechanism of the piezoelectric resonator element 10 according to the embodiment. Referring to FIG. 2, a voltage is supplied to the first and second excitation electrodes 50, 52 of one of the pair of the resonating arms 14, and a voltage is also supplied to the first and second excitation electrodes 50, 52 of the other resonating arm 14. The first excitation electrode 50 and the second excitation electrode 52 are wired crossly and couple to an alternating-current (AC) source such that a value of the electric potential (positive electric potential in the case illustrated in FIG. 2) at the first excitation electrode 50 of one resonating arm 14 (left one in the drawing) becomes equal to a value of the electric potential at the second excitation electrode 52 of the other resonating arm 14 (right one in the drawing), and the electric potential (negative electric potential in the case illustrated in FIG. 2) at the second excitation electrode 52 of one resonating arm 14 (left one in the drawing) becomes equal to the electric potential at the first excitation electrode 50 of the other resonating arm 14 (right one in the drawing). In this way, the AC voltage, which is a drive voltage, is supplied. When the voltage is applied, an electric field is generated as denoted by the arrow in FIG. 2, and the pair of the resonating arms 14 are excited and flexurally vibrated such that the resonating arms 14 vibrate in the opposite phase each other (the end parts of the resonating arms 14 move such that they repeatedly come close and apart). The AC voltage is adjusted in advance so as to vibrate the resonating arms 14 in a fundamental mode.

Piezoelectric Resonator

Figure 3:
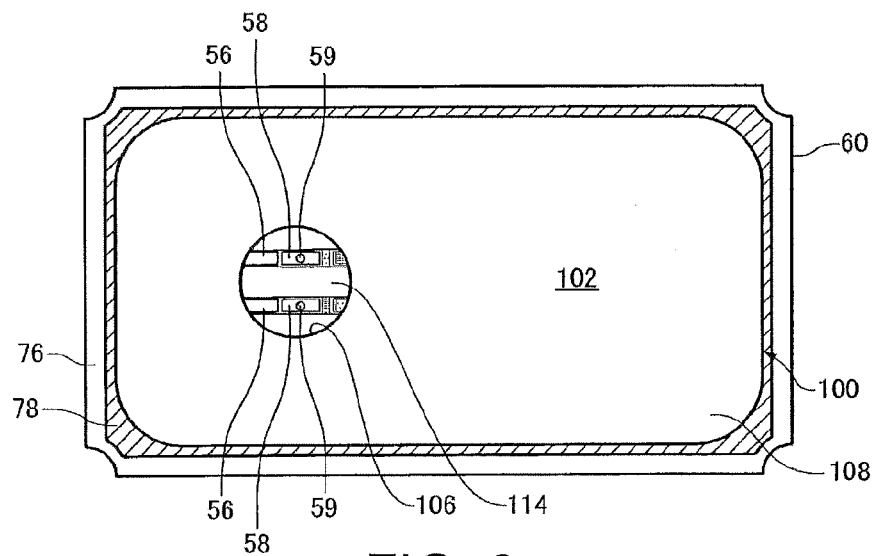
FIG. 3 is a plan view of a piezoelectric resonator according to an embodiment.
Figure 4:
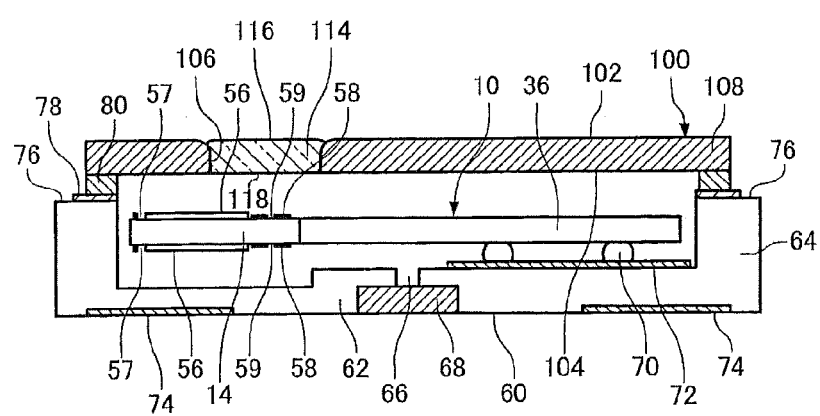
FIG. 4 is a side view of the piezoelectric resonator shown in FIG. 3 and whose frame wall is partially removed to show the structure underneath.
Figure 5:
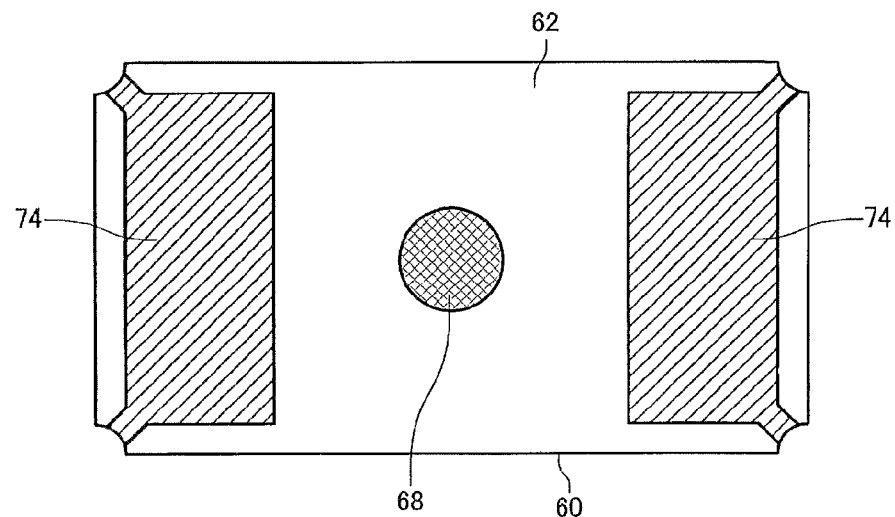
FIG. 5 is a bottom view of the piezoelectric resonator shown in FIG. 3.

FIG. 3 is a plan view of a piezoelectric resonator according to the embodiment. FIG. 4 is a side view of the piezoelectric resonator shown in FIG. 3 and whose frame wall is partially removed to show the structure underneath. FIG. 5 is a bottom view of the piezoelectric resonator shown in FIG. 3.

In the piezoelectric resonator element 10 which is embedded in the piezoelectric resonator, an opening 59 is formed in the second metal film 58. The surface of the front-back faces 16 of the resonating arm 14 is exposed through the opening 59.

The piezoelectric resonator includes the package 60. The package 60 includes a bottom part 62 on which the piezoelectric resonator element 10 is fixed, and a frame wall 64 that closes round the bottom part 62. A vent-hole 66 through which vacuuming is performed is provided in the bottom part 62. The vent-hole 66 is closed with a seal 68 which is made of a brazing material (such as AuGe).

The piezoelectric resonator element 10 is fixed on the bottom part 62 of the package 60. The supporting arms 36 are attached to the package 60 and the resonating arms 14 stay contactless with or float in the package 60 by the supporting arms 36. A part of the bottom part 62 where opposes the end part of the resonating arm 14 is made lower than the other part thereby the resonating arm 14 will not contact with the bottom part 62 even when the resonating arm 14 is inflected. The extension electrode 53 which is formed on the supporting arm 36 (see FIG. 1) is electrically coupled to a wiring 72 which is formed on the bottom part 62 through a conductive adhesive 70. The wiring 72 is electrically coupled to a external electrode 74 which is disposed on the bottom face of the package 60. The piezoelectric resonator element 10 has the two supporting arms 36. The two external electrodes 74 are provided on the package 60. The extension electrode 53 on one of the two supporting arms 36 is electrically coupled to one of the two external electrodes 74. The extension electrode 53 on the other of the two supporting arms 36 is electrically coupled to the other of the two external electrodes 74. The external electrodes 74 are soldered so as to electrically coupled and mounted on a circuit substrate (unshown in the drawing).

The whole of the package 60 can be made of metal. Where the package 60 is primarily made of non-metal material such as ceramics, an upper edge face 76 of the frame wall 64 is metalized. For example, a multilayer film including a Mo (or W) film, on top of which a Ni film and on top of which a Au film is formed is disposed on the non-metal part of the frame wall 64. The upper edge face 76 is made of for example Au. The upper edge face 76 is situated above the bottom part 62 and has a shape surrounding the bottom part 62.

A ring 80 is fixed on the upper edge face 70 with a brazing material layer 78 interposed therebetween. The brazing material layer 78 is made of for example an alloy that contains Ag. The ring 80 is disposed so as to extend along the normal line of the upper edge face 76 and so as to surround the bottom part 62 in the seamless manner above the bottom part 62. The ring 80 is provided for seam welding and is made of for example kovar. A lid 100 is fixed on the ring 80.

Lid for Piezoelectric Resonator

Figure 6:
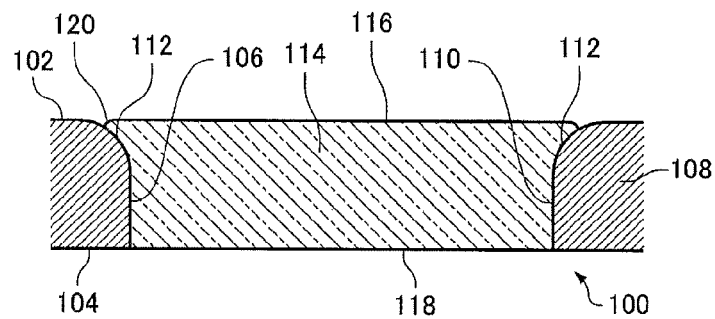
FIG. 6 is an enlarged sectional view of a part of a lid for the piezoelectric resonator according to the embodiment.

FIG. 6 is an enlarged sectional view of a part of a lid for the piezoelectric resonator according to the embodiment. The lid 100 is disposed along the normal line of the package 60 in which the piezoelectric resonator element 10 is fixed and covers an opening of the package 60. The lid 100 includes a frame 108 that has a though hole 106 penetrating a front face 102 and a back face 104. The front face 102 and the back face 104 of the frame 108 are also the front face 102 and the back face 104 of the lid 100. The through hole 106 has a circular shape. The through hole 106 includes a vertical inner wall face 110 which is provided vertical to the front face 102 and the back face 104 and in a part of the thickness direction of the frame 108 (at least in the middle part of the frame). The through hole 106 also includes a curved inner wall face 112 ("curved" means a rounded shape in this description) whose curved-plane edge couples with the front face 102 and/or the back face 104 at the opening edge of at least one of the front face 102 and the back face 104. In the case shown in FIG. 6, the curved inner wall face 112 is provided only at the opening edge of the front face 102 (the face opposite to the face closer to the package 60). The opening edge of the back face 104 (the face closer to the package 60) has a right angle with the back face 104. In this case, the vertical inner wall face 110 is formed so as to reach the opening edge of the back face 104.

Figure 11:
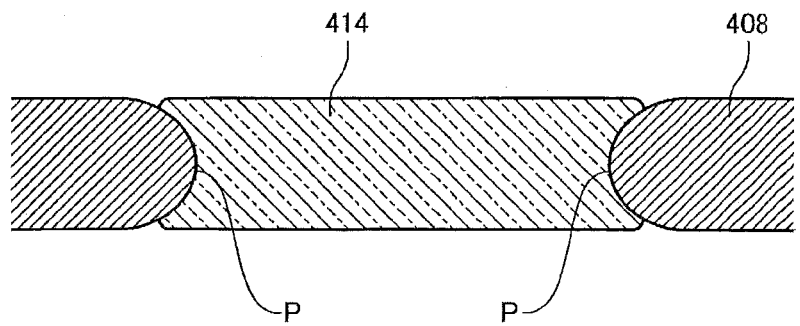
FIG. 11 illustrates the lid for the piezoelectric resonator of a comparative example.

According to the embodiment, the through hole 106 has the vertical inner wall face 110 which is disposed vertical to the front face 102 and the back face 104. When a force works in the thickness direction of an optically transparent part 114 and the frame 108, the stress will be de-concentrated at the vertical inner wall face so that it is possible to prevent the optically transparent part 114 from being broken. In addition, it is possible to elongate the sealing path between the front face 102 and the back face 104. Moreover, a face of the optically transparent part 114 which is opposite to the curved inner wall face 112 has a curved face so that there is a small possibility of cracking. If the though hole 106 consists of the vertical inner wall face 110 and a flat tapered face, a protruding corner is formed and the stress will be concentrated there, increasing the possibility of cracking in the optically transparent part 114. A comparative example is shown in FIG. 11. Referring to FIG. 11, where the whole inner wall face of a frame 408 is a curved face, stress is concentrated at a vertex P of the inner wall face when a force is applied in the direction in which the glass contracts and stretches, increasing the possibility of cracking in an optically transparent part 414.

The lid 100 includes the optically transparent part 114 which is made of a thermally-softened material such as glass and resin. The optically transparent part 114 has a upper face 116 and a lower face 118 which is disposed parallel to the upper face 116 at least its center. A rounded portion 120 is formed on the edge of the optically transparent part 114. The rounded portion 120 at the edge goes over the curved inner wall face 112 of the though hole 106 in the frame 108 and the normal direction of the upper face of the lid 100. The upper face 116 of the optically transparent part 114 faces in the same direction as the direction in which the front face 102 of the frame 108 faces. The lower face 118 of the optically transparent part 114 is situated in the through hole 106 so as to face in the same direction as the direction in which the back face 104 of the frame 108 faces. The optically transparent part 114 closely contacts with at least a part (or the whole) of the vertical inner wall face 110 and at least a part of the curved inner wall face 112 (for example only the part where contacts with the vertical inner wall face 110 other than the front face 102 and the back face 104 of the frame 108). At least one of the upper face 116 and the lower face 118 of the optically transparent part 114 is leveled with the front face 102 and the back face 104 of the frame 108 (does not protrudes out from the front face 102 and the back face 104 of the frame 108). However, in the example shown in FIG. 6, a groove which is formed with the curved inner wall face 112 of the though hole 106 and with the rounded portion 120 of the optically transparent part 114 is disposed between the front face 102 of the frame 108 and the upper face 116 of the optically transparent part 114.

Figure 7:
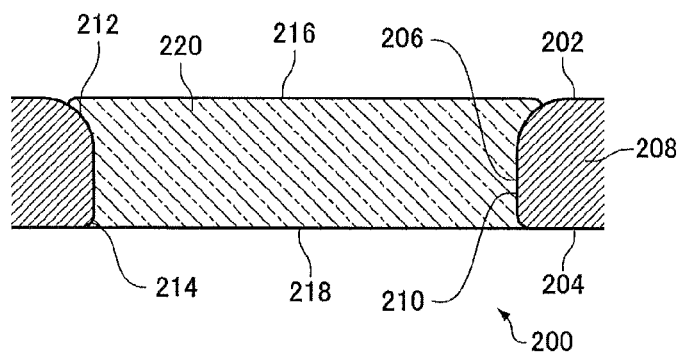
FIG. 7 illustrates a modification example of the lid for the piezoelectric resonator according to the embodiment.

FIG. 7 illustrates a modification example. Referring to FIG. 7, a through hole 206 has a first curved inner wall face 212 whose curved face is coupled with a front face 202 at the opening edge of the front face 202, and a second curved inner wall face 214 whose curved face is coupled with a back face 204 at the opening edge of the back face 204. The curvature radius of the first curved inner wall face 212 is larger than the curvature radius of the second curved inner wall face 214. In this way it is possible to dissipate the stress effectively when a force is applied in the thickness direction. More specifically, a compressive stress works at the interface between the first curved inner wall face 212 and an optically transparent part 220 when a force is applied in the direction from an upper face 216 to a lower face 218. Whereas a compressive stress works at the interface between the second curved inner wall face 214 and the optically transparent part 220 when a force is applied in the direction from the lower face 218 to the upper face 216. These compressive stresses can reduce a shear stress between a vertical inner wall face 210 and the optically transparent part 220, and the joint strength between a frame 208 and the optically transparent part 220 is enhanced.

According to the modification example illustrated in FIG. 7, the optically transparent part 220 is pushed toward a table 130 as the back face 204 faces the table 130 in the same step as a step where the optically transparent part 114 is pushed into the through hole 206, which will be described in detail later. In this step, the optically transparent part 220 edges into the gap between the second curved inner wall face 214 and the table 130, the frame 208 is then pushed up, and the optically transparent part 220 protrudes out from the back face 204 of the frame 208. However, since the curvature radius of the second curved inner wall face 214 is smaller than the curvature radius of the first curved inner wall face 212, the volume of the optically transparent part 220 which protrudes out from the back face 204 of the frame 208 can be made smaller compared to a case where the frame 208 is reversed and the optically transparent part 220 is pushed toward the table. Because the curvature radius of the first curved inner wall face 212 is larger than the curvature radius of the second curved inner wall face 214, the joint strength between the frame 208 and the optically transparent part 220 against the force that works in the direction from the upper face 216 to the lower face 218 of the optically transparent part 220 is stronger than the joint strength thereof against the force that works in the opposite direction. A lid 200 is disposed such that the back face 204 to which the second curved inner wall face 214 is coupled opposes the package 60, in other words, such that the back face 204 to which the second curved inner wall face 214 faces the inner side of the package. In this way, the package has a strong physical strength against an outside force. Therefore it is possible to provide a highly reliable piezoelectric resonator. A method for manufacturing the frame 208 which is shown in FIG. 7 includes a step in which a plate-shaped material is pressed in the direction from its front face to back face, and a step in which the backside is polished.

Figure 8:
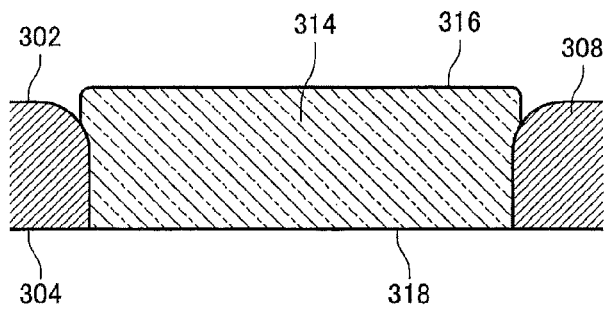
FIG. 8 illustrates another modification example of the lid for the piezoelectric resonator according to the embodiment.

FIG. 8 illustrates another modification example. Referring to FIG. 8, at least one of an upper face 316 and a lower face 318 (for example, the upper face 316) of an optically transparent part 314 protrudes out from a front face 302 or a back face 304 (for example, the front face 302) of a frame 302.

The lid 100 is disposed such that the lower face 118 of the optically transparent part 114 opposes the second metal film 58, and is placed down along the normal direction of the bottom part 62, the frame wall 64 and the lid 100 so as to cover the opening of the package 60.

Method for Manufacturing Piezoelectric Resonator

A method for manufacturing a piezoelectric resonator according to the embodiment includes the formation of the piezoelectric resonator element 10. Where the piezoelectric resonator element 10 is made of quartz crystal, a quartz wafer has a Cartesian coordinate system consisting of a X axis, a Y axis and a Z axis, and a Z-cut quartz wafer whose rotated angle is 0-5 degree with the Z axis clockwise and which has a prescribed thickness is adopted. To form the piezoelectric resonator element from the Z-cut quartz wafer, the wafer is cut and polished. A plurality of the piezoelectric resonator elements 10 which are coupled each other is cut out from a quartz wafer, it is then cut into pieces of piezoelectric resonator elements 10. The excitation electrode film, the first metal film 56 and the second metal film 58 are formed on excitation electrode film 10.

Before fixing the piezoelectric resonator element 10 on the package 60, a part of the metal film is removed. More specifically, before the element is embedded in the piezoelectric resonator (but can be before or after the plurality of the piezoelectric resonator elements 10 which are coupled each other and formed of the quartz wafer is cut into pieces of elements), a part of the first metal film 56 is removed and a resonance frequency is adjusted. This removal of the part of the first metal film 56 can be performed by using a laser beam. Because the first metal film 56 is situated closer to the end of the resonating arm 14 than the second metal film 58, it is possible to promote the vibration of the resonating arm 14 (increase the frequency) more effectively. Besides, the first metal film 56 is formed thicker than the second metal film 58 so that the volume of the first metal film 56 will be larger than that of the second metal film 58 when these films are removed by the same area, therefore this vibration promoting effect becomes significant. This frequency adjustment process by removing the first metal film 56 is performed to adjust the frequency roughly so it can be referred as a coarse adjustment.

Figure 9:
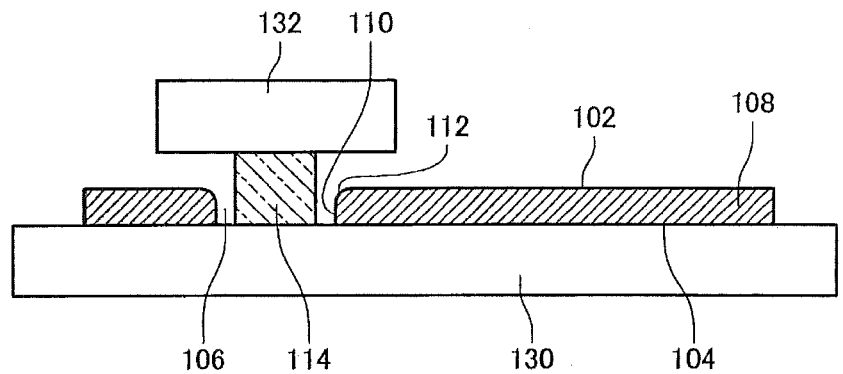
FIG. 9 illustrates a method for forming the lid.

FIG. 9 illustrates how to form the lid. The method for manufacturing the piezoelectric resonator according to the embodiment includes the formation of the lid 100. In this formation process of the lid 100, the optically transparent part 114 whose thickness is larger than the thickness of the frame 108 is placed within the though hole 106 of the frame 108. At this point, the dimension (for example the diameter) of the optically transparent part 114 is smaller than the shape (for example the bore diameter) of the though hole 106. The optically transparent part 114 and the frame 108 are heated, and the optically transparent part 114 is then pushed and pressed toward the frame with the opposing faces which are parallel each other. For example, the frame 108 is placed on the table 130 such that the back face 104 faces the table 130, the optically transparent part 114 is put on the table 130 with the though hole 106 interposed therebetween, the optically transparent part 114 is then pressed by a press tool 132 which opposes the table 130. The optically transparent part 114 is deformed by the pressing so as to have the upper face 116 and the lower face 118 which are parallel each other and so as to closely contact with the inner wall face (the vertical inner wall face 110 and the curved inner wall face 112) of the though hole 106.

According to the embodiment, the though hole 106 has the vertical inner wall face 110 which is provided vertical to the front face 102 and the back face 104. The stress in this part is dissipated even when a force is relatively applied in the thickness direction of the lower face 104 and the frame 108, therefore it is possible to prevent the optically transparent part 114 from being damaged. Moreover, the face opposing the curved inner wall face 112 of the optically transparent part 114 is made as a curved face according to the embodiment so that it is possible to lower the possibility of cracking in the optically transparent part 114. If the though hole 106 consisted of the vertical inner wall face 110 and a flat tapered face, a protruding corner is formed and the stress will be concentrated there, increasing the possibility of cracking in the optically transparent part 114.

Figure 10:
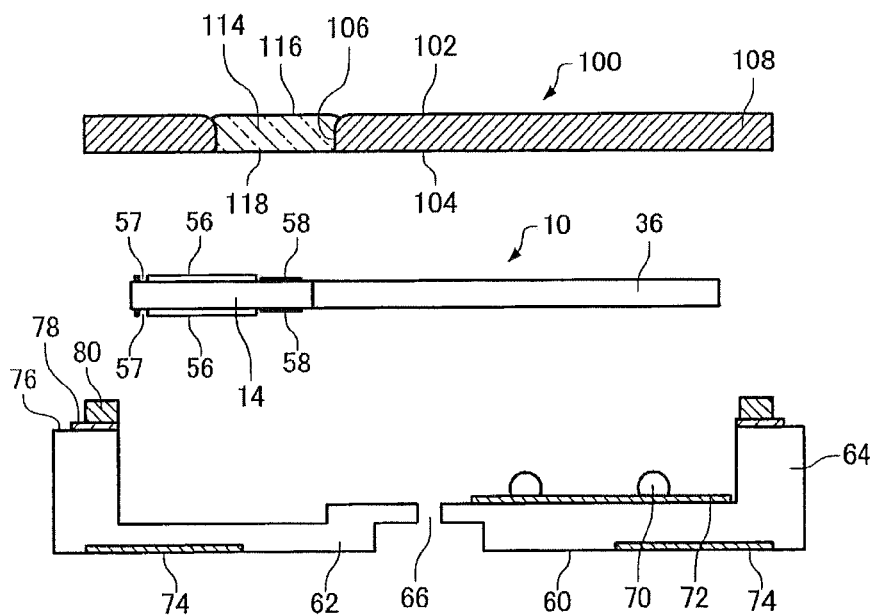
FIG. 10 illustrates a method for manufacturing the piezoelectric resonator according to the embodiment.

FIG. 10 illustrates a method for manufacturing the piezoelectric resonator according to the embodiment. According to the method for the piezoelectric resonator, the package 60 is provided. The ring 80 is fixed in advance on the frame wall 64 of the package 60 by brazing and soldering. The piezoelectric resonator element 10 is fixed on the bottom part 62. According to the method for the piezoelectric resonator, the lid 100 is disposed such that the lower face 108 of the optically transparent part 114 faces the metal film, and the lid 100 (the frame 108) is jointed with the frame wall 64. These parts are jointed by seam welding. In this way, the opening of the package 60 is closed with the lid 100.

After the opening of the package 60 is closed, the inside of the package is made vacuum through the vent-hole 66, and the vent-hole 66 is then sealed with a brazing material 134.

The method for the piezoelectric resonator according to the embodiment includes a step in which a part of the second metal film 58 is removed. This step is performed after the opening of the package 60 is closed with the lid 100 (for example and after the vacuuming). This removal step is conducted in such away that the second metal film 58 is irradiated with a laser beam through the optically transparent part 114. Because the second metal film 58 is situated further to the end of the resonating arm 14 than the first metal film 56, the effect to promote the vibration of the resonating arm 14 (increase the frequency) is smaller than that of the first metal film 56. In this sense, a fine adjustment of the frequency is possible. Besides, the second metal film 58 is formed thinner than the first metal film 56 so that the volume of the second metal film 58 will be smaller than that of the first metal film 56 when these films are removed by the same area, therefore this fine adjustment effect becomes significant.

The method for manufacturing a piezoelectric resonator according to the embodiment includes the above-described processes and the above-described and hitherto-known manufacturing processes of the piezoelectric resonator element.

Application Example of Piezoelectric Resonator

An oscillator and a sensor can be formed by using the above-described piezoelectric resonator. Where an oscillator is formed with an oscillation circuit that includes the piezoelectric resonator, it is possible to obtain an AC signal with high frequency accuracy. A sensor using the piezoelectric resonator utilizes a frequency variation of the piezoelectric resonator element 10 according to a variation in physical quantity. The sensor detects the physical quantity. For example, there are a sensor that detects a stress which is generated by temperature and acceleration, a sensor that detects Coriolis force which is generated by angular velocity, and so on.

The invention is obviously not limited to the specific embodiments described herein, but also encompasses any variations that may be considered by any person skilled in the art, within the general scope of the invention. Note that the invention encompasses the substantially same elements and components as those described in the above-described embodiments (for example, a structure resulting in the same function, method or effect, or a structure having the same purpose or result). The invention also encompasses the structure in which unessential part of the structure described in the above embodiments is replaced by other element. The invention also encompasses the constructions that serve the equivalent function and exert the equivalent effect and the constructions that can achieve the same objective as those of the embodiments. The invention also encompasses the structure in which a hitherto know art is added to the structure described in the above embodiments.

The entire disclosure of Japanese Patent Application Nos: 2007-161282, filed Jun. 19, 2007 and 2008-83416, filed Mar. 27, 2003 are expressly incorporated by reference herein.

What is claimed is:

1. A piezoelectric resonator, comprising:
a piezoelectric resonator element having a resonating arm and a metal film that is formed on the resonating arm;
a package including a bottom part on which the piezoelectric resonator element is fixed and a frame wall that surrounds the bottom part, and having an opening above the bottom part; and a lid including a frame in which a through hole is provided and an optically transparent part that has an upper face and a lower face and is disposed at the through hole, the through hole penetrating a front face and a back face of the frame, the lower face of the optically transparent part being disposed so as to oppose the metal film, and the lid closing the opening of the package such that the lid overlaps with the bottom part and the frame wall, the through hole having a curved inner wall face whose curved face is coupled with at least one of the front face and the back face at at least one opening edge of the front face and the back face and a vertical inner wall face that is disposed substantially perpendicular to the front face and the back face and in a part of a thickness direction of the frame, the optically transparent part in contact with the vertical inner wall face and the curved inner wall face, including a first width at the curved inner wall face that is greater than a second width at the vertical inner wall face.

2. The piezoelectric resonator according to claim 1, the through hole having a first curved inner wall face whose curved face is coupled with the front face at the opening edge of the front face, and a second curved inner wall face whose curved face is coupled with the back face at the opening edge of the back face, wherein a curvature radius of the first curved inner wall face is larger than a curvature radius of the second curved inner wall face.

3. The piezoelectric resonator according to claim 1, wherein the optically transparent part includes the lower face at the second width that is substantially coplanar with the back face.

4. The piezoelectric resonator according to claim 1, an opening of the through hole having a circular shape.

5. The piezoelectric resonator according to claim 1, wherein an opening is formed in the metal film by using a laser beam.

6. A lid for a piezoelectric resonator, comprising;
a frame having a through hole that penetrates a front face and a back face of the frame, the through hole having a curved inner wall face whose curved face is coupled with at least one of the front face and the back face at at least one opening edge of the front face and the back face and a vertical inner wall face that is disposed substantially perpendicular to the front face and the back face and in a part of a thickness direction of the frame; and
an optically transparent part having an upper face extending in the same direction as the front face and a lower face extending in the same direction as the back face, the optically transparent part in contact with the vertical inner wall face and the curved inner wall face, including a first width at the curved inner wall face that is greater than a second width at the vertical inner wall face, and the lid closing an opening of a package in which a piezoelectric resonator element is fixed such that the lid overlaps with the package.

7. The lid for a piezoelectric resonator according to claim 6, the through hole having a first curved inner wall face whose curved face is coupled with the front face at the opening edge of the front face, and a second curved inner wall face whose curved face is coupled with the back face at the opening edge of the back face, wherein a curvature radius of the first curved inner wall face is larger than a curvature radius of the second curved inner wall face.

8. The lid for a piezoelectric resonator according to claim 6, the optically transparent part includes the lower face at the second width that is substantially coplanar with the back face.

9. The lid for a piezoelectric resonator according to claim 7, an opening of the through hole having a circular shape.

10. A method for manufacturing a piezoelectric resonator, comprising:
a) forming a lid that includes a frame which has a front face and a back face and an optically transparent part whose thickness is larger than a thickness of the frame, by placing the optically transparent part in a through hole that penetrates the front face and the back face of the frame, heating the optically transparent part and the frame, and pressing the optically transparent part with a pair of parallel faces such that the optically transparent part closely contacts with an inner wall face of the through hole and has an upper face and a lower face;
b) providing a package that includes a bottom part, a frame wall surrounding the bottom part, and an opening situated above the bottom part, and fixing a piezoelectric resonator element on the bottom part, the piezoelectric resonator element having a resonating arm and a metal film that is formed on the resonating arm; and
c) closing the opening of the package with the lid by placing the lid such that the lower face of the optically transparent part opposes the metal film, and jointing the frame wall part with the lid,
wherein the through hole having a curved inner wall face whose curved face is coupled with at least one of the front face and the back face at at least one opening edge of the front face and the back face, and a vertical inner wall face that is disposed substantially perpendicular to the front face and the back face and in a part of a thickness direction of the frame, the optically transparent part in contact with the curved inner wall face and at least a part of the curved inner wall face, wherein a first width at the curved inner wall face is greater than a second width at the vertical inner wall face.

11. The method for manufacturing a piezoelectric resonator according to claim 10, wherein the step a) includes placing the frame on a table such that the back face faces the table, disposing the optically transparent part on the table with the though hole interposed therebetween, and pressing the optically transparent part by a press tool that opposes the table, and the through hole having the curved inner wall face whose curved face is coupled with the front face at the opening edge of the front face.

12. The method for manufacturing a piezoelectric resonator according to claim 10, further comprising:
d) removing a part of the metal film with a laser beam, wherein the metal film is removed by irradiating the metal film with the laser beam through the optically transparent part after the opening of the package is closed with the lid.

13. The method for manufacturing a piezoelectric resonator according to claim 12, further comprising:
vacuuming an inside of the closed package through a vent-hole that is formed in the package after the opening of the package is closed with the lid, and closing the vent-hole,
wherein the step d) is conducted after the vacuuming.

14. The method for manufacturing a piezoelectric resonator according to claim 12, wherein the step d) is conducted also before the piezoelectric resonator element is fixed on the bottom part.

* * * * *